(12) United States Patent
Yoshizawa

(10) Patent No.: US 9,434,605 B2
(45) Date of Patent: Sep. 6, 2016

(54) MEMS DEVICE

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/643,268

(22) Filed: Mar. 10, 2015

(65) Prior Publication Data

US 2015/0274508 A1    Oct. 1, 2015

(30) Foreign Application Priority Data

Mar. 25, 2014  (JP) ................ 2014-061566

(51) Int. Cl.
| | | |
|---|---|---|
| *B81B 7/02* | (2006.01) | |
| *B81B 7/00* | (2006.01) | |
| *H01L 23/00* | (2006.01) | |
| *B81C 1/00* | (2006.01) | |

(52) U.S. Cl.
CPC .......... *B81B 7/007* (2013.01); *B81C 1/00333* (2013.01); *H01L 24/83* (2013.01); *B81B 2201/0271* (2013.01); *B81C 2203/0136* (2013.01); *B81C 2203/0145* (2013.01); *H01L 2924/13091* (2013.01); *H01L 2924/1461* (2013.01); *H01L 2924/1532* (2013.01)

(58) Field of Classification Search
CPC .......... B81B 7/007; H01L 2924/1461; H01L 2924/1532; H01L 2924/83
See application file for complete search history.

(56) References Cited

U.S. PATENT DOCUMENTS

| | | | | |
|---|---|---|---|---|
| 5,610,431 | A * | 3/1997 | Martin .................... | G01P 1/023 257/415 |
| 7,994,594 | B2 | 8/2011 | Inaba et al. | |
| 2003/0143775 | A1* | 7/2003 | Brady ..................... | H01L 21/50 438/106 |
| 2005/0067688 | A1* | 3/2005 | Humpston .......... | B81C 1/00293 257/704 |
| 2006/0199297 | A1* | 9/2006 | Kim ...................... | B81B 7/0051 438/52 |
| 2008/0002460 | A1* | 1/2008 | Tuckerman ......... | H01L 31/0203 365/158 |
| 2010/0096712 | A1* | 4/2010 | Knechtel ................ | B81B 7/007 257/415 |
| 2011/0156242 | A1* | 6/2011 | Sakaguchi .......... | B81C 1/00269 257/698 |
| 2015/0145077 | A1* | 5/2015 | Cachia .................. | B81B 7/0074 257/415 |

FOREIGN PATENT DOCUMENTS

| | | |
|---|---|---|
| JP | 2008-221435 A | 9/2008 |
| JP | 2010-223850 A | 10/2010 |

\* cited by examiner

*Primary Examiner* — Allan R Wilson
(74) *Attorney, Agent, or Firm* — Oliff PLC

(57) ABSTRACT

A present MEMS device includes: a substrate; a functional element that is provided on a surface of the substrate; a structural member that is provided on the surface of the substrate and forms a cavity surrounding the functional element; a first lid portion that is provided with an opening and covers a part of the cavity in such a manner that a gap is present between the first lid portion and the functional element; a receiving portion that is provided between a plurality of electrodes or a plurality of units of wiring on the surface of the substrate and has a receiving face opposing the cozening of the first lid portion via a gap; and a second lid portion including an electrically conductive sealing portion that seals the opening of the first lid portion.

10 Claims, 7 Drawing Sheets

MEMS DEVICE

BACKGROUND

1. Technical Field

The present invention relates to, for example, a MEMS (Micro Electro Mechanical Systems) device in which a functional element, such as a resonator, a sensor and an actuator, and/or an electronic circuit are integrated on one substrate.

2. Related Art

For example, in a MEMS device that includes a resonator with capacitance as a functional element, the resonator is airtightly sealed, in a vacuum state, in a cavity formed in a substrate. Also, even in the case of a functional element that does not require airtight vacuum seal, the functional element is airtightly sealed in a cavity so as to prevent the influences of dust, moisture, and the like.

In order to form a cavity in such a MEMS device, for example, a sacrificial film is formed in a cavity provided with a functional element, the cavity is covered by a first lid portion in which an opening (release hole) is formed in a predetermined position, and then the sacrificial film is removed through release etching. Furthermore, in order to seal the release hole, a second lid portion that includes a sealing portion is formed, through sputtering, on the first lid portion using a sealant of aluminum (Al) and the like.

However, when forming the sealing portion through sputtering, a part of the sealant enters the cavity via the release hole and attaches to a bottom surface of the cavity. Therefore, if a plurality of electrodes or units of wiring connected to different destinations are present on the bottom surface of the cavity immediately below the release hole, these electrodes or units of wiring could possibly be short-circuited. For this reason, traditionally, the plurality of electrodes or units of wiring connected to different destinations cannot be installed in proximity on the bottom surface of the cavity immediately below the release hole.

As related art, JP-A-2008-221435 (paragraphs 0007, 0008 and 0041, FIG. 8) discloses efficient execution of manufacturing processes of an electronic apparatus that is composed of an electronic circuit and a functional element installed in a hollow of a substrate, and that is intended to secure a manufacturing yield and reduce a manufacturing cost. This electronic apparatus has a substrate, a functional element formed on the substrate, and a covering structure that defines a hollow in which the functional element is installed. The covering structure has a layered structure made up of an inter-layer insulating film and a wiring layer that are formed on the substrate so as to surround the hollow. Out of the covering structure, at least apart of an upper covering portion, which covers the hollow from above, in a thickness direction includes a corrosion-resistant layer. The upper covering portion includes a first covering layer with a through-hole facing the hollow, and a second covering layer closing the through-hole.

On the other hand, JP-A-2010-223850 (paragraphs 0012 and 0013, FIG. 5) discloses a MEMS device that can be manufactured in simple processes, can be reduced in size, and has a highly reliable hollow space sealing structure. This MEMS device includes a substrate, a movable portion that is provided with a hole and formed on the substrate via a gap, a pillar that is formed on the substrate and penetrates into the hole without coming into contact with the movable portion, and a cap portion that is supported by the pillar and is formed on the movable portion via a gap.

JP-A-2008-221435 (paragraphs 0007, 0008 and 0041, FIG. 8) and JP-A-2010-223850 (paragraphs 0012 and 0013, FIG. 5) are examples of related art.

JP-A-2008-221435 (paragraphs 0007, 0008 and 0041, FIG. 8) states that it is preferable that the through-hole (release hole) be formed in a position shifted from a position immediately above a MEMS structural member (functional element). This makes it possible to avoid an unfavorable situation in which the material of the second covering layer attaches to the MEMS structural member at the time of formation of the second covering layer. However, JP-A-2008-221435 (paragraphs 0007, 0008 and 0041, FIG. 8) does not disclose prevention of a short circuit that occurs due to the material of the second covering layer attaching to a plurality of electrodes or units of wiring provided on a bottom surface of a cavity. JP-A-2010-223850 (paragraphs 0012 and 0013, FIG. 5) does not disclose prevention of a short circuit of a plurality of electrodes or units of wiring provided on a bottom surface of a cavity, either.

SUMMARY

A first advantage of some aspects of the invention is that, in a MEMS device with a cavity in which a functional element is provided, a short circuit of electrodes or units of wiring provided on a bottom surface of the cavity is prevented, and the cavity is reduced in size. A second advantage of some aspects of the invention is that the strength of a structure of the cavity that houses the functional element is improved. A third advantage of some aspects of the invention is that a second lid portion including a sealing portion that seals a release hole is reduced in thickness. A fourth advantage of some aspects of the invention is that a diameter of the release hole formed in a first lid portion is increased to perform release etching efficiently.

A MEMS device according to a first aspect of the invention includes: a substrate; a functional element that is provided, either directly or via an insulating film, on a surface of the substrate; a structural member that is provided on the surface of the substrate or on a surface of the insulating film, and forms a cavity surrounding the functional element; a first lid portion that is provided with an opening and covers a part of the cavity in such a manner that a gap is present between the first lid portion and the functional element; a receiving portion that is provided between a plurality of electrodes or a plurality of units of wiring on the surface of the substrate or on the surface of the insulating film, and has a receiving face opposing the opening of the first lid portion via a gap; and a second lid portion including an electrically conductive sealing portion that seals the opening of the first lid portion.

According to the first aspect of the invention, the receiving portion with the receiving face opposing the opening of the first lid portion via a gap is provided between the plurality of electrodes or units of wiring. In this way, even if a part of an electrically conductive sealant enters the cavity via the release hole when forming, through sputtering, the sealing portion that seals the release hole, the receiving portion can prevent a short circuit of the plurality of electrodes or units of wiring. As a result, an interval between these electrodes or units of wiring can be reduced, and the cavity can be reduced in size. Furthermore, as the receiving portion opposes the opening of the first lid portion via a gap, it does not obstruct release etching.

Here, the sealing portion may extend to the receiving face of the receiving portion. In this way, together with the first lid portion, the second lid portion including the sealing portion is fixed to the receiving portion, thereby improving the strength of a structure of the cavity that houses the functional element.

Alternatively, the area of the receiving face of the receiving portion may be smaller than the area of the opening of the first lid portion. In this case, a part of the electrically conductive sealant attaches to a bottom surface of the cavity via the release hole when forming, through sputtering, the sealing portion that seals the release hole; however, as the receiving portion fulfills a role of a mask, a short circuit of the plurality of electrodes or units of wiring can be prevented. As a result, an interval between these electrodes or units of wiring can be reduced, and the cavity can be reduced in size.

A MEMS device according to a second aspect of the invention includes: a substrate; a functional element that is provided, either directly or via an insulating film, on a surface of the substrate; a structural member that is provided on the surface of the substrate or on a surface of the insulating film, and forms a cavity surrounding the functional element; a first lid portion that is provided with an opening and covers a part of the cavity in such a manner that a gap is present between the first lid portion and the functional element; an electrically conductive receiving portion that is provided on the surface of the substrate or on the surface of the insulating film, is electrically connected to the functional element, and has a receiving face opposing the opening of the first lid portion via a gap; and a second lid portion including an electrically conductive sealing portion that seals the opening of the first lid portion and extends to the receiving face of the receiving portion.

According to the second aspect of the invention, even if a part of the electrically conductive sealant enters the cavity via the release hole when forming, through sputtering, the sealing portion that seals the release hole, the receiving portion can prevent a short circuit of the electrodes or units of wiring. Moreover, as the electrically conductive receiving portion can be utilized as an external connection electrode, wiring for the functional element can be installed efficiently, and the cavity can be further reduced in size.

With regard to the first or second aspect of the invention, in a plan view, the receiving face of the receiving portion may overlap the opening of the first lid portion and a region surrounding the opening. In this way, even if a part of the sealant enters the cavity via the release hole when forming, through sputtering, the sealing portion that seals the release hole, the receiving face of the receiving portion can catch the sealant. Therefore, even if the second lid portion including the sealing portion is reduced in thickness, the release hole can be sealed. In addition, a diameter of the release hole formed in the first lid portion can be increased to perform release etching efficiently.

The above-referenced receiving portion may be formed of polysilicon doped with impurities. In this case, the receiving portion can be formed simultaneously when forming the functional element with polysilicon doped with impurities. Also, as the receiving portion has electrical conductivity, the receiving portion can be utilized as an external connection electrode.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes embodiments of the invention in detail with reference to the accompanying drawings. It should be noted that the same constituent element is assigned the same reference sign, and redundant descriptions are omitted.

A MEMS device according to the embodiments of the invention is a device in which a functional element, such as a resonator, a sensor and an actuator, and/or an electronic circuit are integrated on one substrate.

Below, as one example, a MEMS device will be described that includes a resonator with capacitance as a functional element, and also includes a MOS field-effect transistor as a semiconductor circuit element. The resonator is airtightly sealed in a cavity formed in a trench (a recessed portion in a surface) of a semiconductor substrate.

First Embodiment

Figure 1:
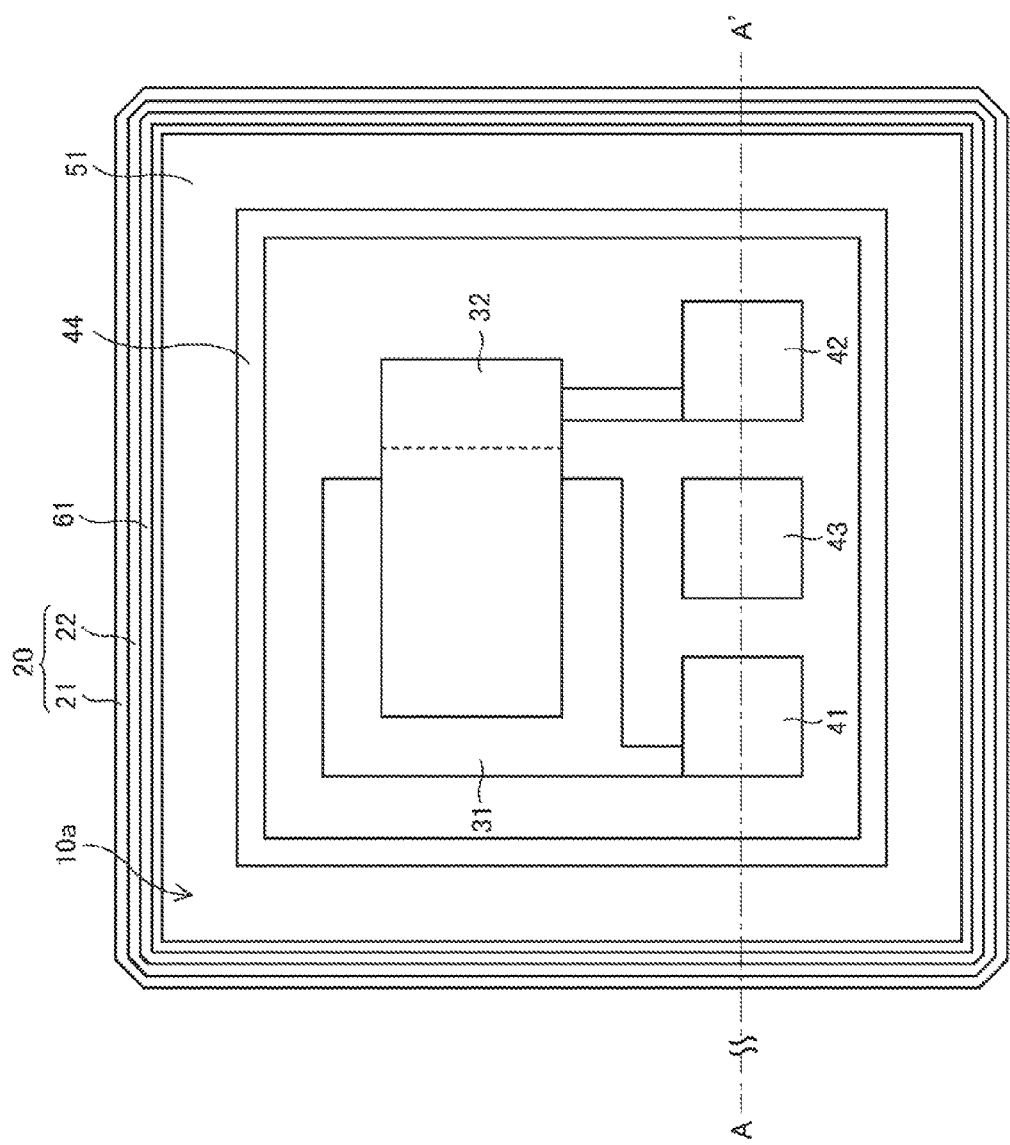
FIG. 1 is a plan view showing the inside of a trench of a MEMS device according to a first embodiment of the invention.
Figure 2:
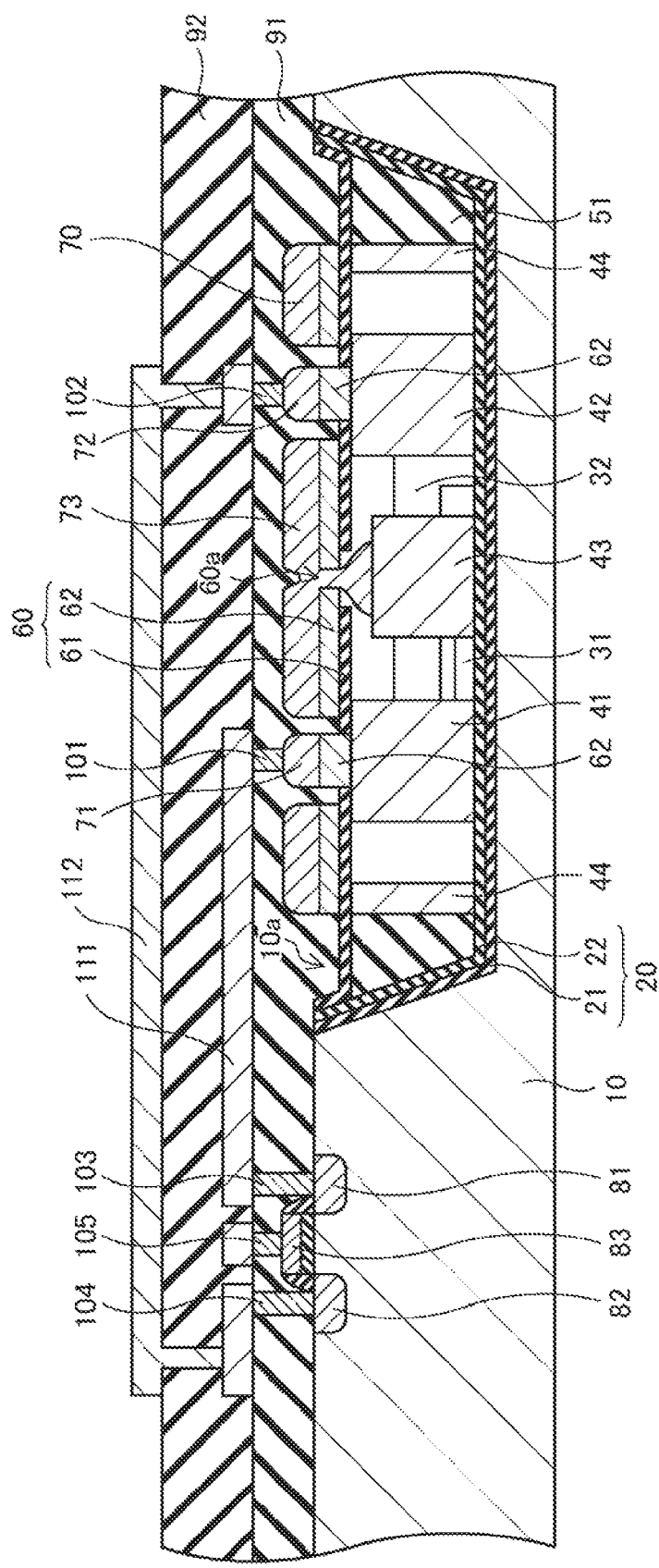
FIG. 2 is a cross-sectional view, taken along the line A-A' of FIG. 1, showing major portions of the MEMS device.

FIG. 1 is a plan view showing a structure of the inside of a trench of a MEMS device according to a first embodiment of the invention. FIG. 1 shows the structure of the inside of trench before a cavity is covered by a lid portion. FIG. 2 is a cross-sectional view, taken along the line A-A' of FIG. 1, showing major portions of the MEMS device. As shown in FIGS. 1 and 2, this MEMS device uses a semiconductor substrate 10 whose main surface (an upper surface in FIG. 2) has a first region (the right side in FIG. 2) in which a trench 10a is formed and a second region (the left side in FIG. 2) in which impurity diffusion regions of a semiconductor circuit element are formed.

A resonator including a lower electrode 31 and an upper electrode 32, external connection electrodes 41 and 42, a receiving portion 43, and a wall portion 44 are provided on a bottom surface of the trench 10a of the semiconductor substrate via an insulating film 20. Also, an insulating film 51 that reinforces the wall portion 44 is provided so as to surround the wall portion 44. It should be noted that the receiving portion 43 and the wall portion 44 may be provided directly on the bottom surface of the trench 10a of the semiconductor substrate. Also, in a case where a substrate with high insulating properties, such as a substrate of glass, ceramics, resin, or the like, is used, the lower electrode 31, the upper electrode 32 and the external connection electrodes 41 and 42 may be provided directly on the substrate.

For example, the insulating film 20 includes an insulating film 21 of silicon dioxide ($SiO_2$) and an insulating film 22 of silicon nitride (SiN). The lower electrode 31, the upper electrode 32 and the external connection electrode 41 to the wall portion 44 are formed of, for example, polysilicon that has been doped with impurities and has electrical conductivity. The insulating film 51 is formed of silicon dioxide ($SiO_2$) and the like.

The upper electrode 32 of the resonator includes a cantilever-like structural member that is fixed at one end and movable at the other end. The external connection electrodes 41 and 42 have, for example, a shape of a prism or a cylinder, and are used to electrically connect the lower electrode 31 and the upper electrode 32 of the resonator to the electronic circuit. The external connection electrode 41 is electrically connected to the lower electrode 31, and may be constructed integrally with the lower electrode 31. On the other hand, the external connection electrode 42 is electrically connected to the upper electrode 32, and may be constructed integrally with the upper electrode 32.

The receiving portion 43 has, for example, a shape of a prism or a cylinder, and is provided between a plurality of electrodes or units of wiring connected to different destinations so as to prevent a short circuit of these electrodes or units of wiring in a later-described sputtering process of a sealant. For example, in the examples shown in FIGS. 1 and 2, the receiving portion 43 is provided between the external connection electrode 41 and the external connection electrode 42. The wall portion 44 is a structural member that forms the cavity surrounding the resonator and the external connection electrode 41 to the receiving portion 43.

In the trench 10a of the semiconductor substrate, a region surrounded by the wall portion 44 is the cavity. The space in the cavity is a high vacuum region. By applying an alternating current voltage between the lower electrode 31 and the upper electrode 32 in the resonator provided in the cavity, mechanical oscillation of the upper electrode 32 is excited by an electrostatic force, and a change in capacitance between the lower electrode 31 and the upper electrode 32 attributed to this mechanical oscillation is detected.

As shown in FIG. 2, the cavity is covered by a lid portion including a first lid portion 60 and a second lid portion 70, in such a manner that a gap is present between the lid portion and the resonator. The first lid portion 60 includes, for example, an insulating film 61 of silicon nitride (SiN) and the like, and a polysilicon film 62 that has electrical conductivity. It should be noted that a surface of the polysilicon film 62 may be provided with a titanium nitride (TiN) film, a salicide film, or the like.

A part of the polysilicon film 62 is provided in a predetermined region of a main surface (an upper surface in the figure) of the external connection electrode 41, and is electrically connected to the external connection electrode 41. Another part of the polysilicon film 62 that is insulated from the above-referenced part is provided in a predetermined region of a main surface (an upper surface in the figure) of the external connection electrode 42, and is electrically connected to the external connection electrode 42.

An opening (release hole) 60a is formed in a predetermined position of a face of the first lid portion 60 opposing the surface of the substrate or the insulating film 20. The part of the first lid portion 60 other than the release hole 60a covers the cavity. The release hole 60a is used in removing, through release etching, a sacrificial film formed in the cavity. Thereafter, with the inside of the cavity placed in a decompressed state (vacuum state), the second lid portion 70 is formed, through sputtering (a high vacuum film formation technique), on a surface of the first lid portion 60 using an electrically conductive sealant of aluminum (Al) and the like.

The second lid portion 70 includes an intermediate conductive member 71, an intermediate conductive member 72 and a sealing portion 73. The intermediate conductive member 71 is electrically connected to the external connection electrode 41 via the polysilicon film 62 and insulated from the other part of the second lid portion 70. The intermediate conductive member 72 is electrically connected to the external connection electrode 42 via the polysilicon film 62 and insulated from the other part of the second lid portion 70. The sealing portion 73 seals the release hole 60a of the first lid portion.

In a sputtering process for forming the second lid portion 70, a part of the electrically conductive sealant enters the cavity via the release hole 60a. In view of this, in the present embodiment, the receiving portion 43 is provided below the release hole 60a so as to prevent a plurality of electrodes or units of wiring from getting short-circuited by the sealant that has entered the cavity.

Figure 3A:
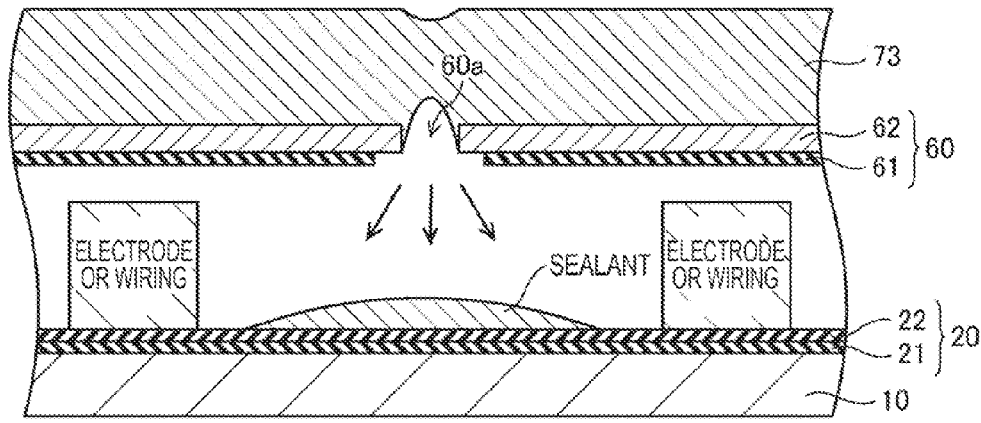
FIGS. 3A to 3C are cross-sectional views showing the states of formation of a sealing portion in a sputtering process.
Figure 3B:
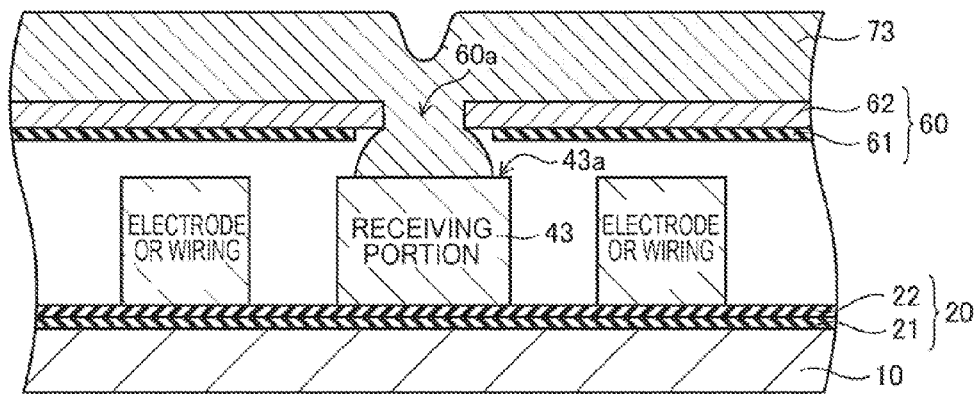
Figure 3C:
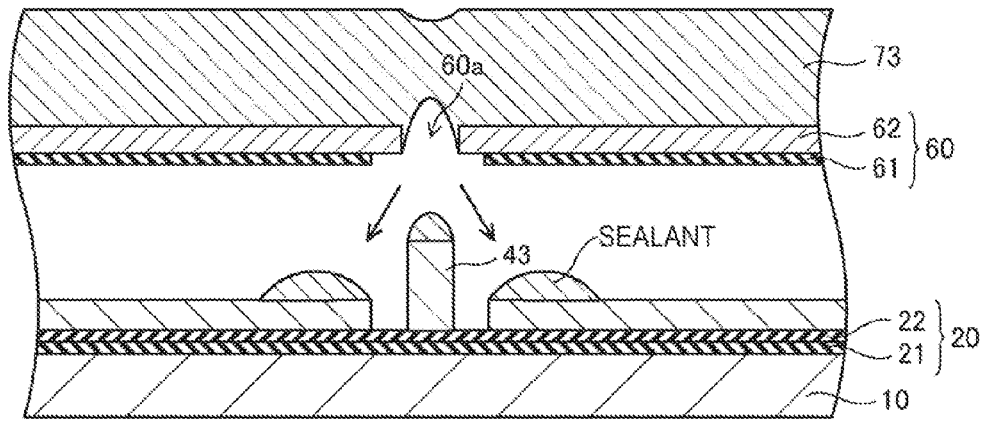

FIGS. 3A to 3C are cross-sectional views showing the states of formation of the sealing portion in the sputtering process. FIG. 3A shows the state of formation of the sealing portion in a MEMS device according to a comparative example. As shown in FIG. 3A, in the MEMS device according to the comparative example, when forming the sealing portion 73 on the surface of the first lid portion 60 through sputtering, a part of the electrically conductive sealant enters the cavity via the release hole 60a and attaches to the bottom surface of the cavity. Therefore, a plurality of electrodes or units of wiring connected to different destinations cannot be installed in proximity on the bottom surface of the cavity immediately below the release hole 60a.

Also, in the MEMS device according to the comparative example, as the release hole 60a is sealed by forming an overhang in the sealing portion 73 above the release hole 60a, a film thickness of the sealing portion 73 needs to be increased in proportion to a diameter of the release hole 60a. Therefore, in order to reduce the sealing portion 73 in thickness, it is necessary to make the release hole 60a minute by reducing the diameter of the release hole 60a.

On the other hand, FIG. 3B shows the state of formation of the sealing portion in the MEMS device according to the first embodiment of the invention. As shown in FIG. 3B, in the MEMS device according to the first embodiment of the invention, the receiving portion 43 is provided between a plurality of electrodes or units of wiring connected to different destinations. The receiving portion 43 has a receiving face 43a that opposes the release hole 60a via a gap.

In this way, even if a part of the electrically conductive sealant enters the cavity via the release hole 60a when forming, through sputtering, the sealing portion 73 that seals the release hole 60a, the receiving portion 43 can prevent a short circuit of the plurality of electrodes or units of wiring. As a result, an interval between these electrodes or units of wiring can be reduced, and the cavity can be reduced in size. Also, as the receiving face 43a of the receiving portion 43 opposes the release hole 60a via the gap, it does not obstruct release etching.

As shown in FIG. 3B, the sealing portion 73 extends to the receiving face 43a of the receiving portion 43. In this way, together with the first lid portion 60, the second lid portion including the sealing portion 73 is fixed to the receiving portion 43, thereby improving the strength of a structure of the cavity that houses the functional element.

In addition, in a plan view, the receiving face 43a of the receiving portion 43 overlaps the release hole 60a and a region therearound. In this way, even if a part of the electrically conductive sealant enters the cavity via the release hole 60a when forming, through sputtering, the sealing portion 73 that seals the release hole 60a, the receiving face 43a of the receiving portion 43 can catch the sealant.

In this case, the release hole 60a can be sealed if the film thickness of the sealing portion 73 on the receiving face 43a is larger than a distance between the face of the first lid portion 60 opposing the surface of the substrate or the insulating film 20 and the receiving face 43a. Therefore, even if the second lid portion including the sealing portion 73 is reduced in thickness, the release hole 60a can be sealed. Accordingly, a shallow trench can be formed in the semiconductor substrate by reducing the second lid portion in thickness.

Furthermore, as the diameter of the release hole 60a no longer depends on the film thickness of the sealing portion 73, the diameter of the release hole 60a formed in the first lid portion 60 can be increased to perform release etching efficiently.

FIG. 3C shows the state of formation of the sealing portion in a MEMS device according to a modification example of the first embodiment according to the invention. As shown in FIG. 3C, in the MEMS device according to the modification example of the first embodiment of the invention, the area of the receiving face 43a of the receiving portion 43 is smaller than the area of the release hole 60a.

In this case, a part of the electrically conductive sealant attaches to the bottom surface of the cavity via the release hole 60a when forming, through sputtering, the sealing portion 73 that seals the release hole 60a; however, as the receiving portion 43 fulfills a role of a mask, a short circuit of a plurality of electrodes or units of wiring can be prevented. As a result, an interval between these electrodes or units of wiring can be reduced, and the cavity can be reduced in size.

Referring back to FIG. 2, the semiconductor circuit element is provided in the second region of the main surface of the semiconductor substrate 10. For example, impurity diffusion regions 81 and 82, which serve as a source and a drain of a MOS field-effect transistor (MOSFET), are provided inside the semiconductor substrate 10, and a gate electrode 83 is provided on the semiconductor substrate 10 via a gate insulating film.

A first insulating layer (inter-layer insulating film) 91 of silicon dioxide ($SiO_2$), BPSG (Boron Phosphorus Silicon Glass), or the like is provided on the semiconductor substrate 10 provided with the lid portion and the semiconductor circuit element. The first insulating layer 91 covers the main surface of the semiconductor substrate 10. The first insulating layer 91 is in contact with the insulating film 61 and insulates the intermediate conductive members 71 and 72 of the second lid portion 70 from the sealing portion 73.

Contact plugs (electrodes) 101 and 102 of tungsten (W) and the like are provided in a first region of the first insulating layer 91. The contact plugs 101 and 102 penetrate the first insulating layer 91 and are electrically connected to the intermediate conductive members 71 and 72, respectively. Also, contact plugs (electrodes) 103 to 105 of tungsten (W) and the like are provided in a second region of the first insulating layer 91. The contact plugs 103 to 105 penetrate the first insulating layer 91 and are electrically connected to the impurity diffusion region 81, the impurity diffusion region 82 and the gate electrode 83, respectively.

Electrical connection to the contact plugs 101 to 105 is implemented on a first wiring layer of aluminum (Al) and the like, which is provided on a surface of the first insulating layer 91. Furthermore, where necessary, a second wiring layer is provided via a second insulating layer 92, and a desired number of wiring layers are installed in a similar manner from then on. In addition, a protection film (not shown) is provided on a surface of a topmost wiring layer.

For example, wiring 111 provided on the first wiring layer brings the contact plug 101 and the contact plug 103 into electrical connection to each other. Also, wiring 112 provided on the second wiring layer brings the contact plug 102 and the contact plug 104 into electrical connection to each other via the first wiring layer. In this way, the resonator can be electrically connected to the semiconductor circuit element.

A description is now given of a method of manufacturing the MEMS device shown in FIGS. 1 and 2.

Figure 4A:
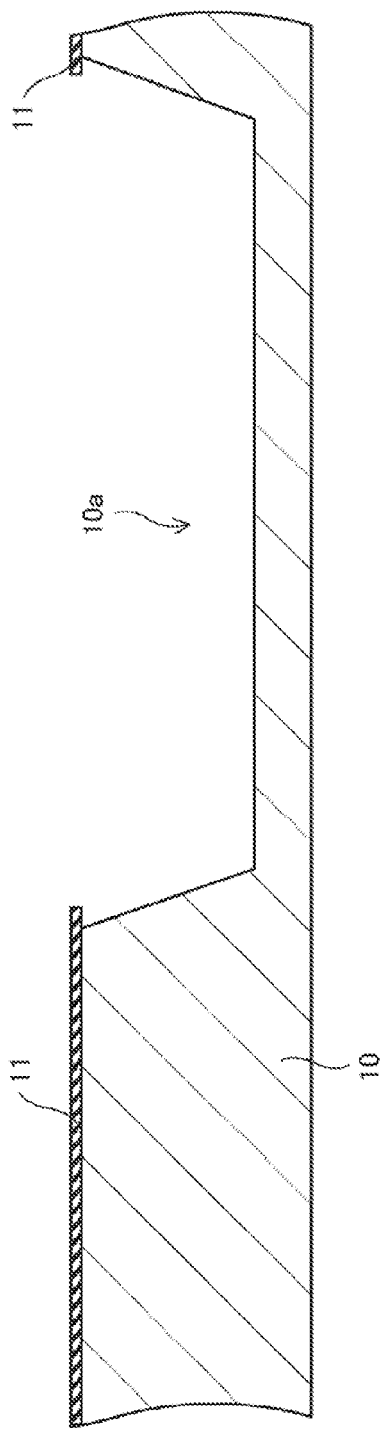
FIGS. 4A and 4B are cross-sectional views pertaining to manufacturing processes of the MEMS device according to the first embodiment of the invention.

FIGS. 4A to 5B are cross-sectional views pertaining to manufacturing processes of the MEMS device according to the first embodiment of the invention. First, for example, by providing a resist 11 using a photolithography technique and applying dry etching to a part of the main surface of the semiconductor substrate 10 constructed from a silicon monocrystal and the like, the deep trench 10a is formed in the first region of the main surface of the semiconductor substrate 10 as shown in FIG. 4A. Thereafter, the resist 11 is removed.

Figure 4B:
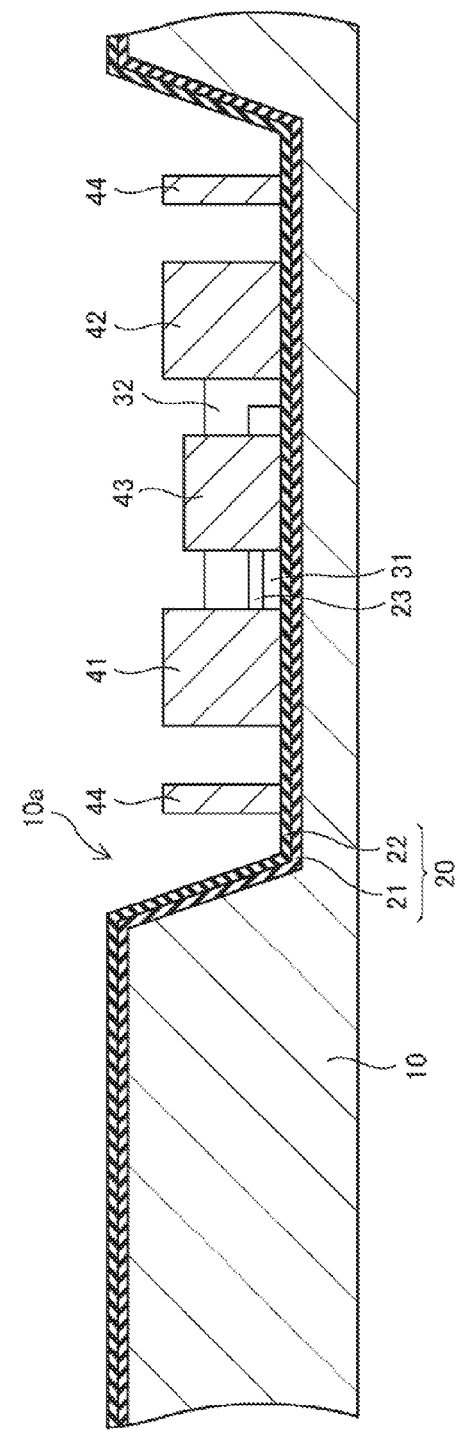

Next, as shown in FIG. 4B, the insulating film 20 is formed on the bottom surface of the trench 10a of the semiconductor substrate. For example, the insulating film 20 includes the insulating film 21 of silicon dioxide ($SiO_2$) and the insulating film 22 of silicon nitride (SiN). The insulating film 22 of silicon nitride (SiN) withstands wet etching (release etching) for removing the later-described sacrificial film in the cavity.

Also, for example, polysilicon that has been doped with impurities and has electrical conductivity is formed on the bottom surface of the trench 10a of the semiconductor substrate via the insulating film 20, and patterning is applied through dry etching that uses a resist. Consequently, the lower electrode 31 of the resonator is formed. Furthermore, after forming a gap sacrificial film 23 on the lower electrode 31, for example, polysilicon that has electrical conductivity is formed, and patterning is applied through dry etching that uses a resist. Consequently, the upper electrode 32 of the resonator, the external connection electrodes 41 and 42, the receiving portion 43, and the wall portion 44 are formed. Thereafter, the gap sacrificial film 23 is removed through wet etching.

In this way, the resonator including the lower electrode 31 and the upper electrode 32, the external connection electrodes 41 and 42 that are electrically connected to the lower electrode 31 and the upper electrode 32, respectively, the receiving portion 43, and the wall portion 44 are formed on the bottom surface of the trench 10a of the semiconductor substrate via the insulating film 20. The wall portion 44 forms the cavity surrounding the resonator, the external connection electrodes 41 and 42, and the receiving portion 43.

Figure 5A:
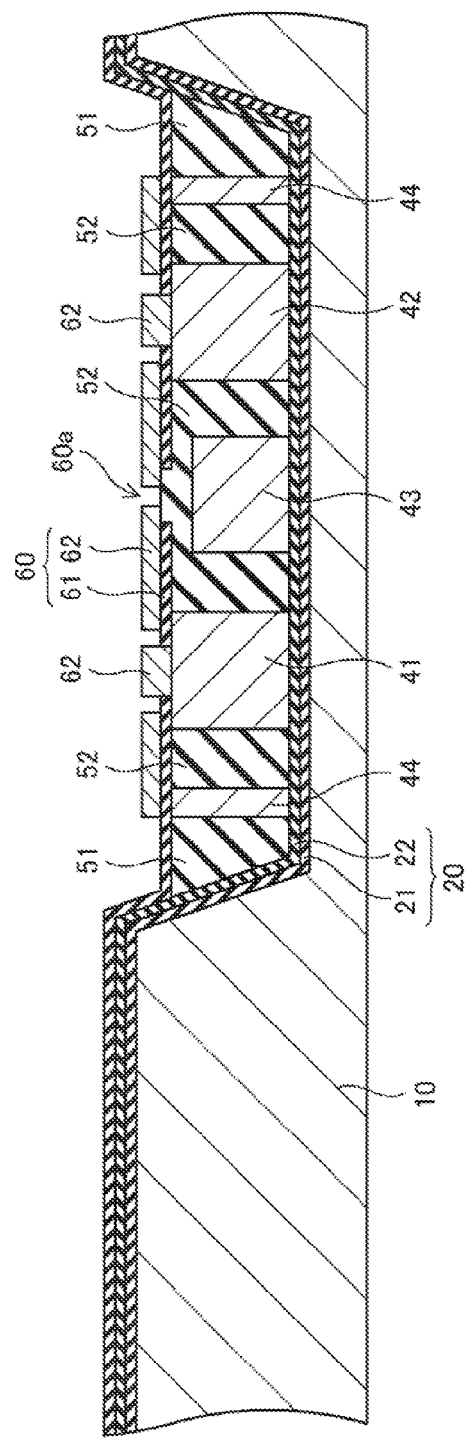
FIGS. 5A and 5B are cross-sectional views pertaining to manufacturing processes of the MEMS device according to the first embodiment of the invention.

Next, after an insulating film of silicon dioxide ($SiO_2$) and the like is deposited, using a plasma CVD technique, on the surface of the semiconductor substrate 10 on which the resonator and the like are formed, the insulating film of silicon dioxide ($SiO_2$) and the like is polished by CMP (Chemical Mechanical Polishing) and further etched. As a result, as shown in FIG. 5A, the insulating film 51 of silicon dioxide (SiO$_2$) and the like is formed so as to surround the wall portion 44 in the trench of the semiconductor substrate 10, and an insulating film 52 of silicon dioxide (SiO$_2$) and the like is formed as a sacrificial film in the cavity.

Next, after an insulating film of silicon nitride (SiN) and the like is formed on the surface of the semiconductor substrate 10 on which the insulating films 51 and 52 and the like are formed, patterning is applied to the insulating film of silicon nitride (SiN) and the like through dry etching that uses a resist. As a result, the insulating film 61 of silicon nitride (SiN) and the like, which covers parts of the main surfaces of the external connection electrodes 41 and 42 and parts of the insulating films 51 and 52, is formed.

Also, after a polysilicon film that has electrical conductivity is formed on the surface of the semiconductor substrate 10 on which the insulating film 61 and the like are formed, patterning is applied to the polysilicon film through dry etching that uses a resist. As a result, the first lid portion 60 including the insulating film 61 and the polysilicon film 62 is formed. The release hole 60a is formed in the first lid portion 60. The part of the first lid portion 60 other than the release hole 60a covers the cavity.

Here, a part of the polysilicon film 62 is provided in the predetermined region of the main surface of the external connection electrode 41, and is electrically connected to the external connection electrode 41. Another part of the polysilicon film 62 that is insulated from the above-referenced part is provided in the predetermined region of the main surface of the external connection electrode 42, and is electrically connected to the external connection electrode 42.

Figure 5B:
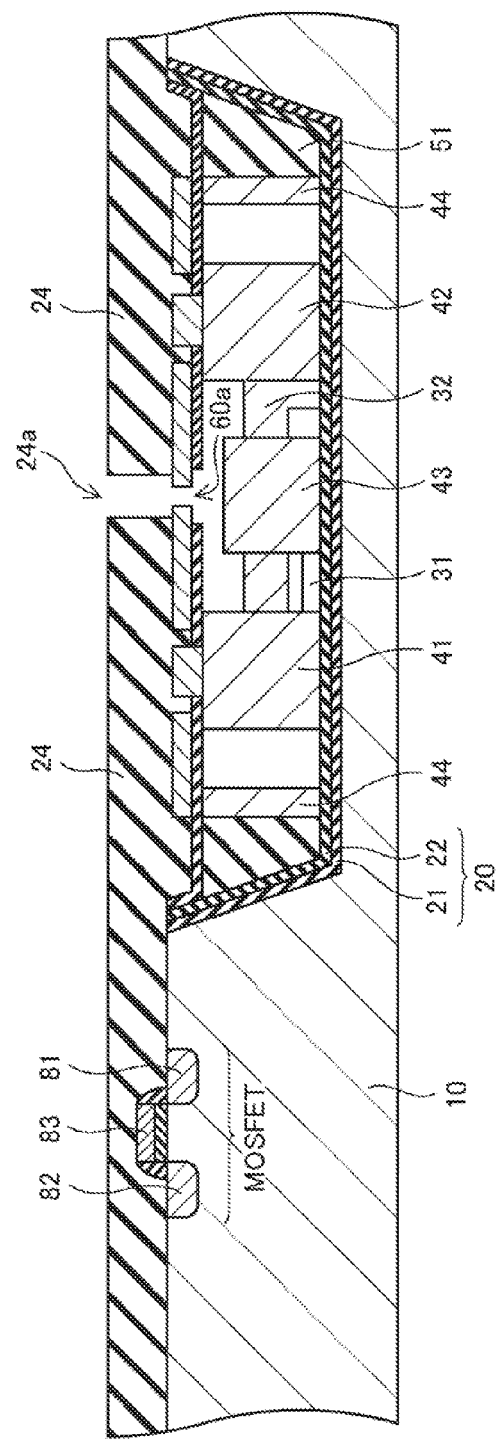

Next, insulating film planarization and the like are applied to the surface of the semiconductor substrate 10 on which the first lid portion 60 and the like are formed. Thereafter, for example, a MOS field-effect transistor (MOSFET) is formed as a semiconductor circuit element in the second region of the main surface of the semiconductor substrate 10 as shown in FIG. 5B.

That is to say, the gate electrode 83 is formed on the semiconductor substrate 10 via the gate insulating film, and the impurity diffusion regions 81 and 82 that serve as the source and the drain are formed inside the semiconductor substrate 10 on both sides of the gate electrode 83. Also, insulating side walls may be formed on side walls of the gate insulating film and the gate electrode 83. Furthermore, an insulating film of a predetermined thickness may be formed in a region surrounding the insulating side walls.

Next, a resist 24 that has an opening 24a in a position corresponding to the release hole 60a of the first lid portion is provided, using a photolithography technique, on the surface of the semiconductor substrate 10 on which the MOS field-effect transistor and the like are formed. Furthermore, the insulating film of silicon dioxide (SiO$_2$) and the like in the cavity, that is to say, the sacrificial film is removed through wet etching (release etching) that uses hydrofluoric acid and the like as an etchant. Thereafter, the resist 24 is removed through asking and the like.

Next, an electrically conductive sealant of aluminum (Al) and the like is deposited on the surface of the first lid portion 60 through sputtering (a high vacuum film formation technique) in a vacuum chamber, and patterning is applied to the deposited sealant through dry etching that uses a resist. In this way, as shown in FIG. 2, the second lid portion 70 is formed on the surface of the first lid portion 60 by the sealant.

The second lid portion 70 includes the intermediate conductive member 71 that is electrically connected to a predetermined region of the external connection electrode 41 via the polysilicon film 62, the intermediate conductive member 72 that is electrically connected to a predetermined region of the external connection electrode 42 via the polysilicon film 62, and the sealing portion 73 that seals the release hole 60a of the first lid portion.

Next, the first insulating layer 91 is formed of silicon dioxide (SiO$_2$), BPSG, or the like. The first insulating layer 91 covers the main surface of the semiconductor substrate 10 on which the first lid portion 60, the second lid portion 70 and the semiconductor circuit element are formed. The first insulating layer 91 is in contact with the insulating film 61 and insulates the intermediate conductive members 71 and 72 of the second lid portion 70 from the sealing portion 73.

Next, the contact plugs 101 to 105 of tungsten (W) and the like are simultaneously formed. The contact plugs 101 and 102 penetrate the first insulating layer 91 and are electrically connected to the intermediate conductive members 71 and 72, respectively, whereas the contact plugs 103 to 105 penetrate the first insulating layer 91 and are electrically connected to the semiconductor circuit element.

Next, the first wiring layer is formed on the surface of the first insulating layer 91 by aluminum (Al) and the like. Electrical connection to the contact plugs 101 to 105 is implemented on the first wiring layer. For example, the wiring 111 provided on the first wiring layer brings the contact plug 101 and the contact plug 103 into electrical connection to each other.

Furthermore, where necessary, the second wiring layer is formed via the second insulating layer 92, and a desired number of wiring layers are formed in a similar manner from then on. For example, the wiring 112 provided on the second wiring layer brings the contact plug 102 and the contact plug 104 into electrical connection to each other via the first wiring layer.

Accordingly, the external connection electrodes 41 and 42 can be electrically connected to the semiconductor circuit element. In this way, a necessary number of wiring layers can be installed, using a standard semiconductor wafer process, on a layer(s) above the cavity that houses the resonator, similarly to a layer(s) above the semiconductor circuit element. Thereafter, the protection film (not shown) is formed on the surface of a topmost wiring layer.

Second Embodiment

Figure 6:
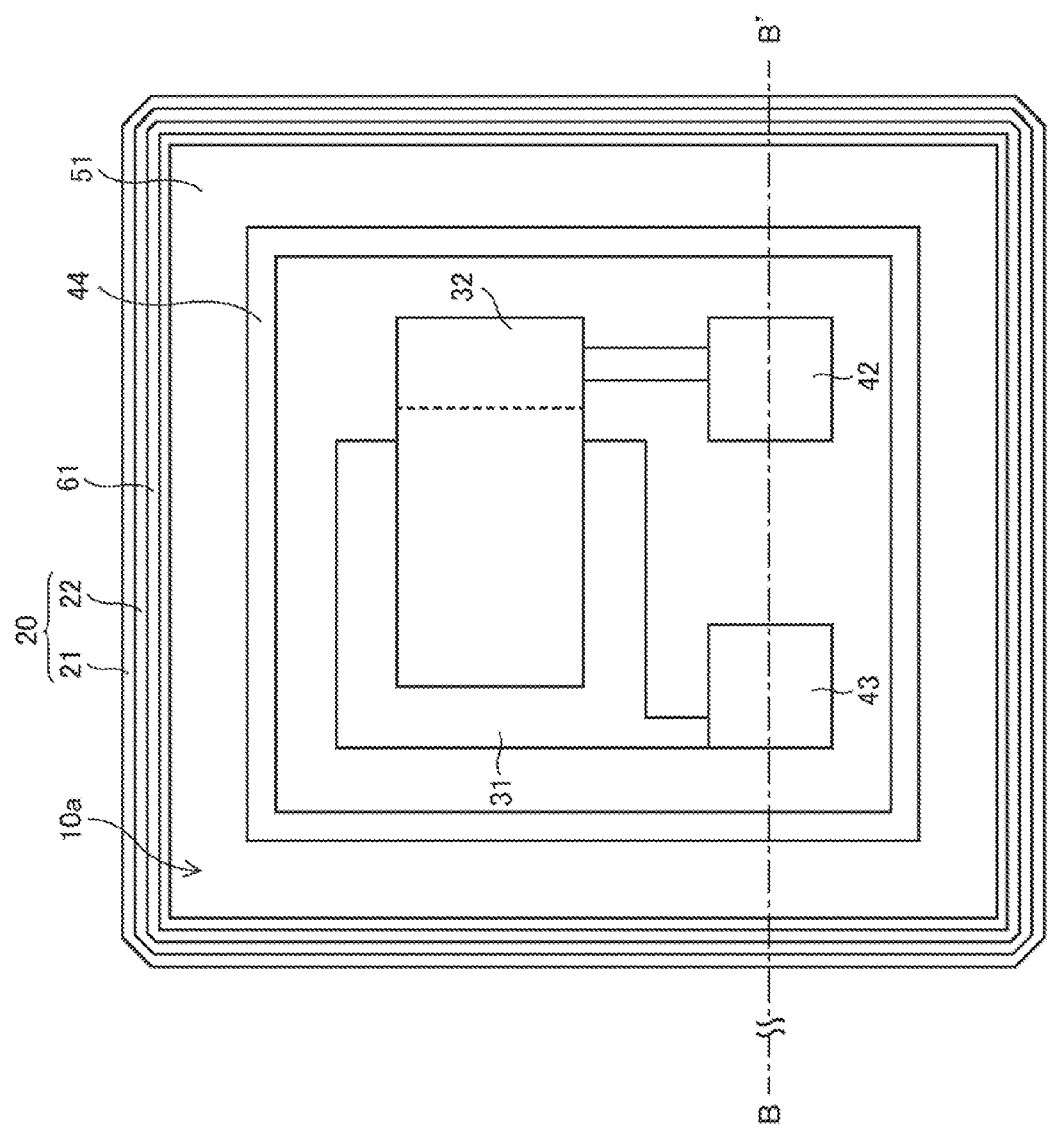
FIG. 6 is a plan view showing the inside of a trench of a MEMS device according to a second embodiment of the invention.
Figure 7:
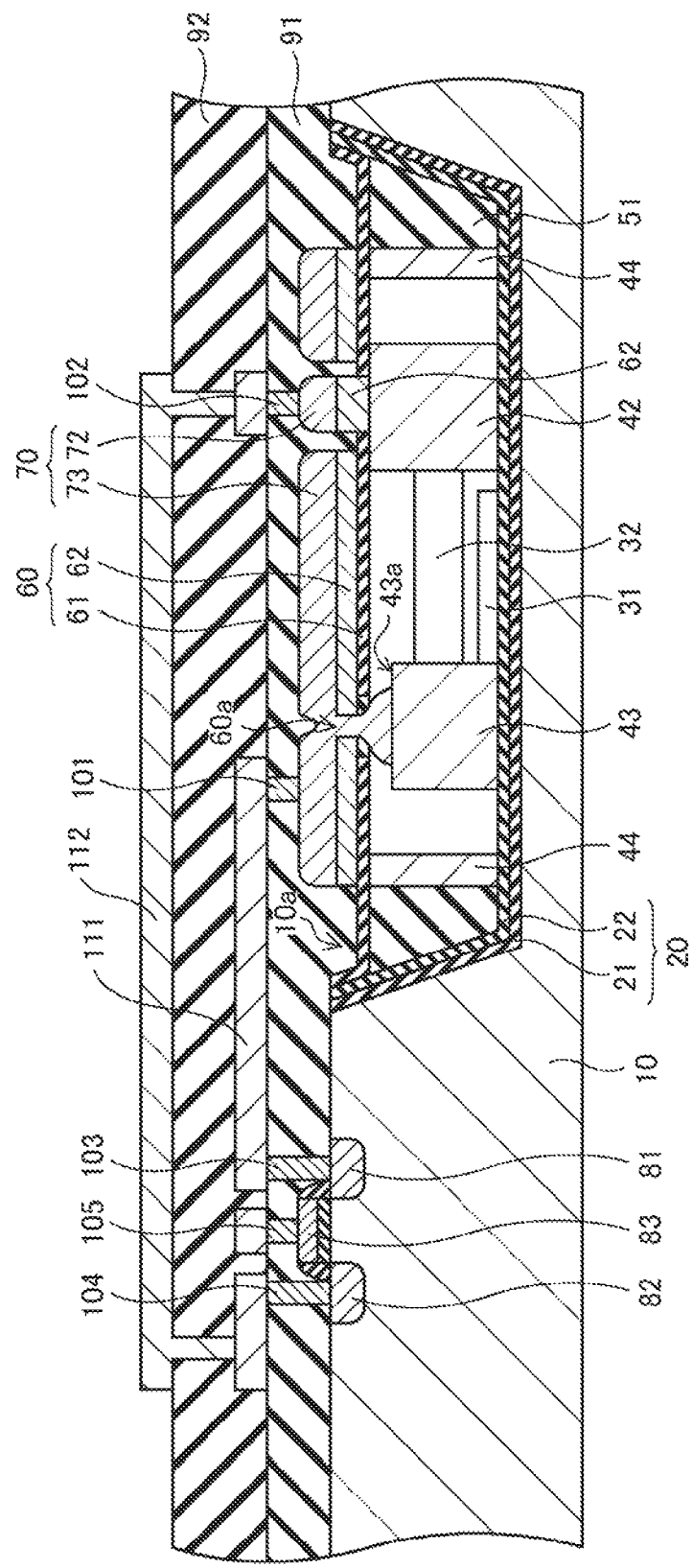
FIG. 7 is a cross-sectional view, taken along the line B-B' of FIG. 6, showing major portions of the MEMS device.

FIG. 6 is a plan view showing a structure of the inside of a trench of a MEMS device according to a second embodiment of the invention. FIG. 6 shows the structure of the inside of trench before a cavity is covered by a lid portion. FIG. 7 is a cross-sectional view, taken along the line B-B' of FIG. 6, showing major portions of the MEMS device. In the second embodiment, an electrically conductive receiving portion 43 is electrically connected to a functional element and constitutes an external connection electrode. In other respects, the second embodiment is similar to the first embodiment.

A resonator including a lower electrode 31 and an upper electrode 32, an external connection electrode 42, the receiving portion 43, and a wall portion 44 are provided on a bottom surface of a trench 10a of a semiconductor substrate via an insulating film 20. Also, an insulating film 51 that reinforces the wall portion 44 is provided so as to surround the wall portion 44. It should be noted that the wall portion 44 may be provided directly on the bottom surface of the trench 10a of the semiconductor substrate. Also, in a case where a substrate with high insulating properties, such as a substrate of glass, ceramics, resin, or the like, is used, the lower electrode 31, the upper electrode 32, the external connection electrode 42 and the receiving portion 43 may be provided directly on the substrate.

For example, the insulating film 20 includes an insulating film 21 of silicon dioxide ($SiO_2$) and an insulating film 22 of silicon nitride (SiN). The lower electrode 31, the upper electrode 32 and the external connection electrode 42 to the wall portion 44 may be formed of polysilicon that has been doped with impurities and has electrical conductivity. In this case, the receiving portion 43 can be formed simultaneously when forming the lower electrode 31 and the upper electrode 32 of the resonator and the like. Also, as the receiving portion 43 has electrical conductivity, the receiving portion 43 can be utilized as the external connection electrode. The insulating film 51 is formed of silicon dioxide ($SiO_2$) and the like.

The receiving portion 43 and the external connection electrode 42 have, for example, a shape of a prism or a cylinder, and are used to electrically connect the lower electrode 31 and the upper electrode 32 of the resonator to an electronic circuit. The receiving portion 43 is electrically connected to the lower electrode 31, and may be constructed integrally with the lower electrode 31. On the other hand, the external connection electrode 42 is electrically connected to the upper electrode 32, and may be constructed integrally with the upper electrode 32.

As shown in FIG. 7, the cavity is covered by a lid portion including a first lid portion 60 and a second lid portion 70, in such a manner that a gap is present between the lid portion and the resonator. The first lid portion 60 includes, for example, an insulating film 61 of silicon nitride (SiN) and the like, and a polysilicon film 62 that has electrical conductivity. It should be noted that a surface of the polysilicon film 62 may be provided with a titanium nitride (TiN) film, a salicide film, or the like. A part of the polysilicon film 62 is provided in a predetermined region of a main surface (an upper surface in the figure) of the external connection electrode 42, and is electrically connected to the external connection electrode 42.

An opening (release hole) 60a is formed in the first lid portion 60. The part of the first lid portion 60 other than the release hole 60a covers the cavity. The release hole 60a is used in removing, through release etching, a sacrificial film formed in the cavity. Thereafter, with the inside of the cavity placed in a decompressed state (vacuum state), the second lid portion 70 is formed, through sputtering (a high vacuum film formation technique), on a surface of the first lid portion 60 using an electrically conductive sealant of aluminum (Al) and the like.

In a sputtering process for forming the second lid portion 70, a part of the electrically conductive sealant enters the cavity via the release hole 60a. In view of this, in the present embodiment, the receiving portion 43 is provided below the release hole 60a so as to catch the sealant that has entered the cavity.

The receiving portion 43 has a receiving face 43a that opposes the release hole 60a via a gap. In a plan view, the receiving face 43a of the receiving portion 43 overlaps the release hole 60a and a region therearound. In this way, even if a part of the electrically conductive sealant enters the cavity via the release hole 60a when forming, through sputtering, a sealing portion 73 that seals the release hole 60a, the receiving face 43a of the receiving portion 43 can catch the sealant.

The second lid portion 70 includes an intermediate conductive member 72 and the sealing portion 73. The intermediate conductive member 72 is electrically connected to the external connection electrode 42 via the polysilicon film 62 and insulated from the other part of the second lid portion 70. The sealing portion 73, which is electrically conductive, seals the release hole 60a of the first lid portion and extends to the receiving face 43a of the receiving portion 43. In this way, the sealing portion 73 is electrically connected to the receiving portion 43 that is electrically connected to the lower electrode 31 of the resonator and constitutes the external connection electrode.

A first insulating layer (inter-layer insulating film) 91 of silicon dioxide ($SiO_2$), BPSG (Boron Phosphorus Silicon Glass), or the like is provided on the semiconductor substrate 10 provided with the lid portion and a semiconductor circuit element. The first insulating layer 91 covers a main surface of the semiconductor substrate 10. The first insulating layer 91 is in contact with the insulating film 61 and insulates the intermediate conductive member 72 of the second lid portion 70 from the sealing portion 73.

Contact plugs (electrodes) 101 and 102 of tungsten (W) and the like are provided in a first region of the first insulating layer 91. The contact plugs 101 and 102 penetrate the first insulating layer 91 and are electrically connected to the sealing portion 73 and the intermediate conductive member 72, respectively. Also, contact plugs (electrodes) 103 to 105 of tungsten (W) and the like are provided in a second region of the first insulating layer 91. The contact plugs 103 to 105 penetrate the first insulating layer 91 and are electrically connected to an impurity diffusion region 81, an impurity diffusion region 82 and a gate electrode 83, respectively.

Electrical connection to the contact plugs 101 to 105 is implemented on a first wiring layer of aluminum (Al) and the like, which is provided on a surface of the first insulating layer 91. Furthermore, where necessary, a second wiring layer is provided via a second insulating layer 92, and a desired number of wiring layers are installed in a similar manner from then on. In addition, a protection film (not shown) is provided on a surface of a topmost wiring layer.

For example, wiring 111 provided on the first wiring layer brings the contact plug 101 and the contact plug 103 into electrical connection to each other. Also, wiring 112 provided on the second wiring layer brings the contact plug 102 and the contact plug 104 into electrical connection to each other via the first wiring layer. In this way, the resonator can be electrically connected to the semiconductor circuit element.

According to the second embodiment of the invention, even if a part of the electrically conductive sealant enters the cavity via the release hole 60a when forming, through sputtering, the sealing portion 73 that seals the release hole 60a, the receiving portion 43 can prevent a short circuit of electrodes or units of wiring. Moreover, as the electrically conductive receiving portion 43 can be utilized as the external connection electrode, wiring for the functional element can be installed efficiently, and the cavity can be further reduced in size.

While the above-described embodiments have discussed a MEMS device with a cavity that is formed in a deep trench of a semiconductor substrate, the invention is by no means limited to the above-described embodiments. For example, the invention can be utilized in a MEMS device with a cavity that is formed in a shallow trench of a substrate or on the substrate, and can be modified in many ways by a person of ordinary skill in the art within the technical ideas of the invention.

The entire disclosure of Japanese Patent Application No. 2014-061566, filed Mar. 25, 2014 is expressly incorporated by reference herein.

What is claimed is:

1. A MEMS device, comprising:
 a substrate;
 a functional element that is provided, either directly or via an insulating film, on a surface of the substrate;
 a structural member that is provided on the surface of the substrate or on a surface of the insulating film, and forms a cavity surrounding the functional element;
 a first lid portion that is provided with an opening and covers a part of the cavity in such a manner that a gap is present between the first lid portion and the functional element, the first lid portion including a lower portion formed of an insulating material and an upper portion formed of a conductive material;
 a receiving portion that is provided between a plurality of electrodes or a plurality of units of wiring on the surface of the substrate or on the surface of the insulating film, and has a receiving face opposing the opening of the first lid portion via another gap; and
 a second lid portion including an electrically conductive sealing portion that seals the opening of the first lid portion.

2. The MEMS device according to claim 1, wherein
 in a plan view, the receiving face of the receiving portion overlaps the opening of the first lid portion and a region surrounding the opening.

3. The MEMS device according to claim 1, wherein
 the sealing portion extends to the receiving face of the receiving portion.

4. The MEMS device according to claim 1, wherein
 the area of the receiving face of the receiving portion is smaller than the area of the opening of the first lid portion.

5. The MEMS device according to claim 1, wherein
 the receiving portion is formed of polysilicon doped with impurities.

6. The MEMS device according to claim 1, the receiving portion comprising a first electrode, further comprising a second electrode separate from the receiving portion.

7. The MEMS device according to claim 1, the lower portion of the first lid including a first opening and a second opening, the upper portion of the first lid including a first opening and a second opening, the first opening of the lower portion and the first opening of the upper portion are not continuous and the second opening of the lower portion and the second opening of the upper portion is continuous.

8. The MEMS device according to claim 1, the receiving portion comprising a first electrode, and the first electrode is connected to the upper portion of the first lid through the opening of the lower portion of the first lid.

9. The MEMS device according to claim 6, a height of the receiving portion is different from a height of the second electrode.

10. A MEMS device, comprising:
 a substrate;
 a functional element that is provided, either directly or via an insulating film, on a surface of the substrate;
 a structural member that is provided on the surface of the substrate or on a surface of the insulating film, and forms a cavity surrounding the functional element;
 a first lid portion that is provided with an opening and covers a part of the cavity in such a manner that a gap is present between the first lid portion and the functional element, the first lid portion including a lower portion formed of an insulating material and an upper portion formed of a conductive material;
 an electrically conductive receiving portion that is provided on the surface of the substrate or on the surface of the insulating film, is electrically connected to the functional element, and has a receiving face opposing the opening of the first lid portion via another gap, the electrically conductive receiving portion being a first electrode;
 a second lid portion including an electrically conductive sealing portion that seals the opening of the first lid portion and extends to the receiving face of the receiving portion; and
 a second electrode connected to a contact plug by a member that is different from the electrically conductive sealing portion,
 the first electrode being connected to the electrically conductive sealing portion through the opening.

* * * * *